United States Patent
Tamura (10) Patent No.: US 7,812,660 B2
(45) Date of Patent: Oct. 12, 2010

(54) LEVEL SHIFT CIRCUIT

(75) Inventor: Akio Tamura, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 26 days.

(21) Appl. No.: 12/210,643

(22) Filed: Sep. 15, 2008

(65) Prior Publication Data

US 2009/0134930 A1 May 28, 2009

(30) Foreign Application Priority Data

Nov. 28, 2007 (JP) ............................. 2007-306788

(51) Int. Cl.
*H03L 5/00* (2006.01)
(52) U.S. Cl. ........................................ 327/333; 326/68
(58) Field of Classification Search .................. None
See application file for complete search history.

(56) References Cited

U.S. PATENT DOCUMENTS

| | | | |
|---|---|---|---|
| 5,493,245 A * | 2/1996 | Kao et al. | 327/333 |
| 6,259,299 B1 * | 7/2001 | Ryu | 327/333 |
| 2003/0001616 A1 * | 1/2003 | Fujikawa et al. | 326/80 |
| 2004/0160258 A1 * | 8/2004 | Tobita | 327/333 |
| 2006/0125521 A1 * | 6/2006 | Kim | 326/81 |
| 2009/0027100 A1 * | 1/2009 | Choi | 327/333 |

FOREIGN PATENT DOCUMENTS

| | | |
|---|---|---|
| JP | 11-68534 | 3/1999 |
| JP | 2002-251174 | 9/2002 |
| JP | 2004-72289 | 3/2004 |
| JP | 2007-208584 | 8/2007 |

* cited by examiner

*Primary Examiner*—Tuan Lam
(74) *Attorney, Agent, or Firm*—Dickstein Shapiro LLP (57) ABSTRACT

A level shift circuit prevents a through current in an output circuit connected to a high-voltage power supply, thereby reducing power consumption and noise and enabling a high-speed operation. The level shift circuit includes first and second bias generating circuits that supply a gate bias voltage to each of a PMOS transistor as a first transistor and a NMOS transistor as a second transistor. Each of the first and second bias voltage generating circuits includes a series connection of a diode-connected PMOS transistor and a diode-connected NMOS transistor. The discharge of a capacitor to the high-voltage power supply is prevented, and a through current is prevented when an output signal transitions from a high-level to a low-level and vice versa, whereby power consumption and noise can be reduced.

16 Claims, 8 Drawing Sheets

Thus, in the conventional level shift circuit, a through current may flow upon inversion of the input voltage B from low-level to high-level due to manufacturing process variations.

The voltage drop across the diode connection of each of the PMOS transistor M3 and the PMOS transistor M4 also varies due to the bias current supplied to these devices. Specifically, the gate voltage A when the PMOS transistor M1 is off varies also depending on the bias current supplied to the PMOS transistor M3 and the PMOS transistor M4. Unless the bias current value is appropriately set, the through current could possibly flow for a longer time.

However, the related art does not discuss the bias current supplied to the PMOS transistor M3 and the PMOS transistor M4.

Thus, there has been the problem that there is the duration of time in which both of the PMOS transistor M1 and the NMOS transistor M2 are on upon inversion of the input voltage B from high-level to low-level, which results in a large through current.

SUMMARY OF THE INVENTION

It is therefore a general object of the present invention to provide a novel and useful level shift circuit in which one or more of the aforementioned problems of the related art are eliminated. A more specific object is to prevent a through current in an output circuit connected to a high-voltage power supply in a level shift circuit, whereby power consumption and noise can be reduced, and a high-speed operation can be enabled.

In one aspect, the invention provides a level shift circuit for producing a high voltage amplitude output signal from a low voltage amplitude input signal. The apparatus comprises complementary-type first and second transistors that are connected in series between a high-voltage power supply and a ground potential; a capacitor connected between control electrodes of the first and second transistors; a first bias generating circuit configured to apply a first bias voltage between the high-voltage power supply and the control electrode of the first transistor; a second bias generating circuit configured to apply a second bias voltage between the ground potential and the control electrode of the second transistor; a first switch unit configured to turn on or off depending on the low voltage amplitude input signal in order to supply power to the first bias generating circuit while the output signal is at a high-level and to stop the supply of power to the first bias generating circuit while the output signal is at a low-level; and a second switch unit configured to turn on or off depending on the low voltage amplitude input signal in order to stop a supply of power to the second bias generating circuit while the output signal is at the high-level, and to supply power to the second bias generating circuit while the output signal is at the low-level. The high voltage amplitude output signal is outputted from a connecting node of the first and second transistors.

Thus, the through current upon inversion of an output signal can be eliminated when there are variations in the threshold voltage of MOS transistors due to manufacturing process variations. The discharge of the capacitor can also be eliminated, and the first and second transistors can be turned on or off with a signal having a small amplitude, whereby a high-speed operation can be realized.

In a preferred embodiment, the first and second bias voltages are the same and are either equal to a sum of threshold voltages of the first transistor and the second transistor or smaller than the sum by a predetermined value.

Thus, the through current can be further prevented, and when the sum of the threshold voltages is made somewhat smaller, the through current can be completely removed, whereby power consumption and noise can be reduced.

In another embodiment, the first bias generating circuit includes a first voltage limiting circuit connected between the high-voltage power supply and the control electrode of the first transistor, and a first bias current generating circuit configured to supply a first bias current to the first voltage limiting circuit. The first voltage limiting circuit includes a series connection of a diode-connected transistor having the same characteristics as those of the first transistor and a diode-connected transistor having the same characteristics as those of the second transistor. The second bias generating circuit includes a second voltage limiting circuit connected between the control electrode of the second transistor and the ground potential, and a second bias current generating circuit configured to supply a second bias current to the second voltage limiting circuit. The second voltage limiting circuit includes a series connection of a diode-connected transistor having the same characteristics as those of the first transistor and a diode-connected transistor having the same characteristic as those of the second transistor.

In another embodiment, in order to make the sum of the threshold voltages somewhat smaller, a threshold voltage of at least one of the transistor having the same conductivity type as the first transistor and the transistor having the same conductivity type as the second transistor in each of the first and second voltage limiting circuits is lower than the threshold voltage of the first transistor or the second transistor of the corresponding conductivity type.

In another embodiment, the first bias current generating circuit includes a first current limiting unit of which one end is connected to the control electrode of the first transistor, and the first switch unit connected between the other end of the first current limiting unit and the ground potential.

Thus, the activation/deactivation of the first bias circuit can be controlled by the first switch circuit.

In another preferred embodiment, the first current limiting unit includes a resistor or a constant current source.

In another preferred embodiment, the second bias current generating circuit includes a second current limiting unit of which one end is connected to the control electrode of the second transistor and of which the other end is connected to the high-voltage power supply or a power supply whose voltage is lower than that of the high-voltage power supply.

In another preferred embodiment, the level shift circuit further includes a third switch unit connected between the other end of the second current limiting unit and the power supply whose voltage is lower than that of the high-voltage power supply. The third switch unit is turned on or off depending on the low voltage amplitude input signal.

Thus, by allowing the supply of power to the second current limiting circuit to be terminated while the second bias circuit is deactivated, power consumption can be reduced.

In another preferred embodiment, the third switch unit turns off while the output signal is at the high-level and turns on while the output signal is at the low-level.

In another preferred embodiment, the second current limiting unit includes a resistor or a constant current source.

In another preferred embodiment, the second switch unit is connected between the control electrode of the second transistor and the ground potential. Thus, the activation/deactivation of the second bias circuit can be controlled by the second switch circuit.

In another preferred embodiment, the first switch unit turns on while the output signal is at the high-level and turns off while the output signal is at the low-level.

In another preferred embodiment, the second switch unit turns on while the output signal is at the high-level and turns off while the output signal is at the low-level.

In yet another preferred embodiment, each of the first switch unit and the second switch unit includes a transistor having the same characteristics as those of the second transistor. The low voltage amplitude input signal of the same phase is applied to a control electrode of each of the first switch unit and the second switch unit. The first switch unit is configured to turn off first when the first switch unit and the second switch unit transition from an on-state to an off-state depending on the input signal.

Thus, the charge stored in the capacitor can be reliably preserved.

In another preferred embodiment, the level shift circuit further includes a third bias generating circuit connected between the first switch unit and the ground potential and configured to produce a third bias voltage.

Thus, the first switch circuit can be turned off first reliably.

In yet another preferred embodiment, the third bias generating circuit includes a series connection of one or more diode-connected transistors.

In yet another embodiment, the third bias generating circuit includes a resistor.

Figure 1:
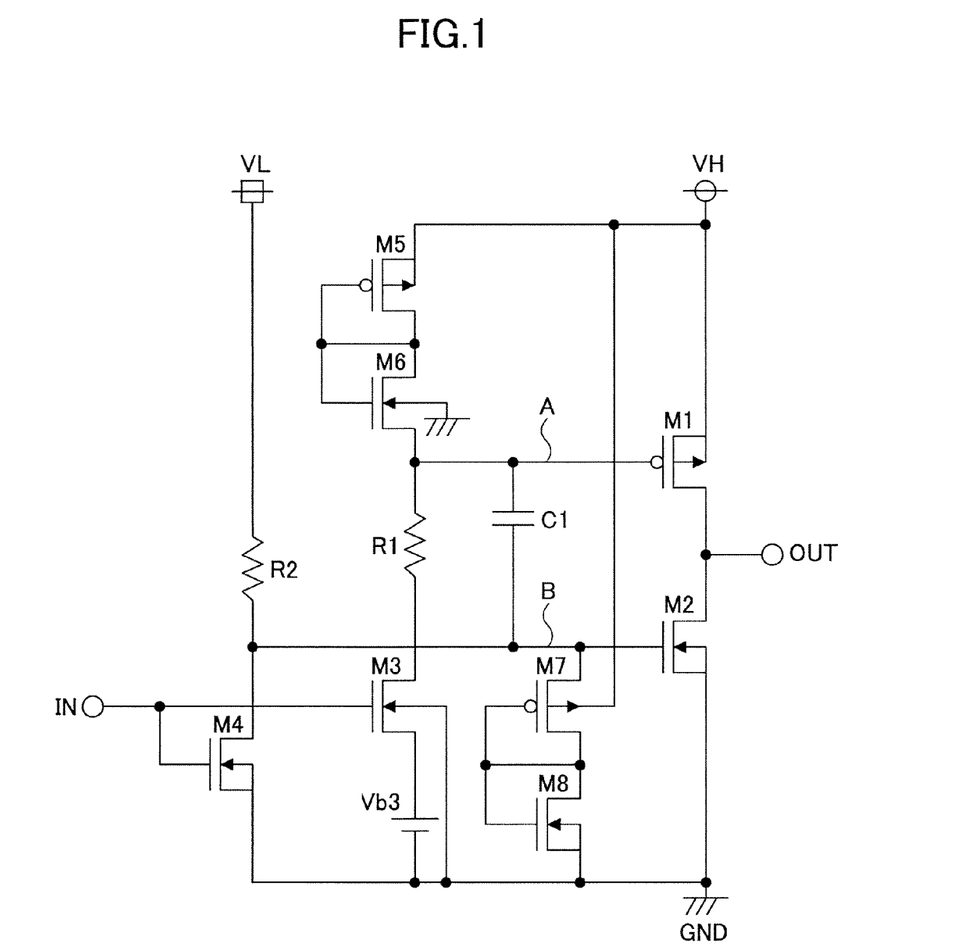
FIG. 1 shows a circuit diagram of a level shift circuit according to a first embodiment of the invention.

In accordance with an embodiment, as shown in FIG. 1, each of the first and second bias generating circuits that provide the gate bias voltage to the PMOS transistor M1, which is the first transistor, and the NMOS transistor M2, which is the second transistor, includes a series connection of a diode-connected PMOS transistor M5 and a diode-connected NMOS transistor M6, or a series connection of a diode-connected PMOS transistor M7 and a diode-connected NMOS transistor M8. Thus, the discharge of the capacitor C1 to the high-voltage power supply VH is prevented, and the through current can be prevented upon transition of the output signal from high-level to low-level and vice versa. In addition, power consumption and noise can be reduced.

Furthermore, because any variations in the threshold voltages of the PMOS transistors and the MOS transistors, either in the same direction or different directions, due to manufacturing process variations, can be mutually compensated, the through current due to manufacturing process variations can also be prevented.

By making the threshold voltages of the PMOS transistor M5 and the PMOS transistor M7 that produce bias voltages somewhat smaller than the threshold voltage of the first transistor M1 by a predetermined value, and/or by making the threshold voltages of the NMOS transistors M6 and M8 that produce bias voltages smaller than the threshold voltage of the second transistor M2 by a predetermined value, the through current can be completely eliminated.

Because the gate signals of the PMOS transistor M1 and the NMOS transistor M2 have the same amplitude that is smaller, the operation speed is increased compared with conventional circuits.

BRIEF DESCRIPTION OF THE DRAWINGS

These and other objects, features and advantages of the invention will be apparent to those skilled in the art from the following detailed description of the invention, when read in conjunction with the accompanying drawings in which.

DETAILED DESCRIPTION OF THE PREFERRED EMBODIMENTS

In the following, a description is given of preferred embodiments of the present invention with reference to the drawings.

Embodiment 1

FIG. 1 shows a circuit diagram of a level shift circuit according to a first embodiment.

The level shift circuit according to the present embodiment includes PMOS transistors M1, M5, and M7, and NMOS transistors M2, M3, M4, M6, and M8. The level shift circuit further includes a capacitor C1, resistors R1 and R2, a bias voltage Vb3, a low-voltage power supply terminal VL, a high-voltage power supply terminal VH, a grounding terminal GND, an input terminal IN, and an output terminal OUT.

The source of the PMOS transistor M1, which is a first transistor, is connected to the high-voltage power supply terminal VH. The drain of the PMOS transistor M1 is connected to the drain of the NMOS transistor M2, which is a second transistor.

The source of the NMOS transistor M2 is connected to the ground potential GND. Between the gate of the PMOS transistor M1 and the gate of the NMOS transistor M2, a capacitor C1 is connected.

The connected drains of the PMOS transistor M1 and the NMOS transistor M2 are connected to the output terminal OUT.

Between the high-voltage power supply terminal VH and the gate of the PMOS transistor M1, there is connected a series connection (first voltage limiting circuit) of the PMOS transistor M5 and the NMOS transistor M6, which are each diode-connected.

The gate of the PMOS transistor M1 is connected to one end of the resistor R1. The other end of the resistor R1 is connected to the drain of the NMOS transistor M3, which is a first switch unit. Between the source of the NMOS transistor M3 and the ground potential GND, there is connected a third bias voltage Vb3. The gate of the NMOS transistor M3 is connected to the input terminal IN.

Between the gate of the NMOS transistor M2 and the ground potential GND, there is connected a circuit (second voltage limiting circuit) consisting of a series connection of the PMOS transistor M7 and the NMOS transistor M8, which are each diode-connected. The gate of the NMOS transistor M2 is connected to one end of the resistor R2 and to the drain of the NMOS transistor M4, which is a second switch unit. The other end of the resistor R2 is connected to the low-voltage power supply terminal VL.

The source of the NMOS transistor M4 is connected to the ground potential GND. The gate of the NMOS transistor M4 is connected to the input terminal IN.

While in the example shown in FIG. 1, the other end of the resistor R2 is connected to the low-voltage power supply terminal VL, it may be connected to the high-voltage power supply terminal VH.

An operation of the level shift circuit is described with reference to FIG. 2, which shows a timing chart.

Figure 2:
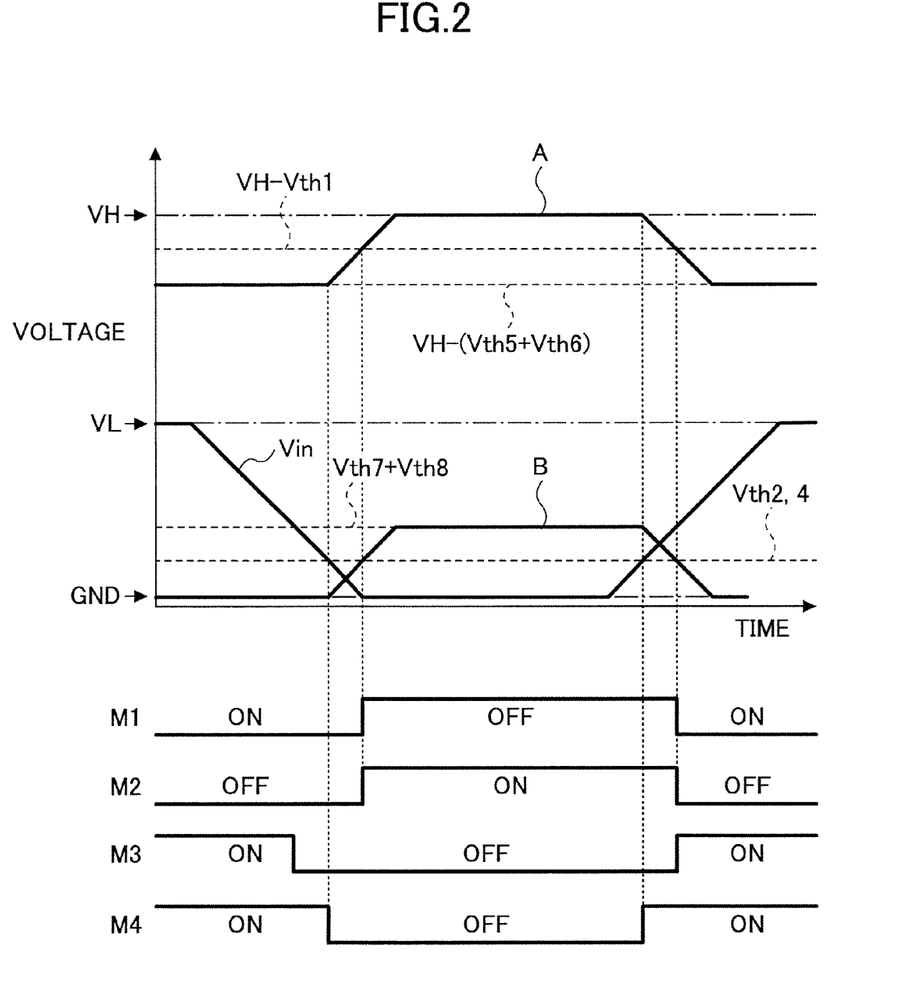
FIG. 2 shows a timing chart illustrating an operation of the level shift circuit shown in FIG. 1.

The timing chart of FIG. 2 shows changes in an input voltage Vin inputted to the input terminal IN, the gate voltage A of the PMOS transistor M1, the gate voltage B of the NMOS transistor M2, and corresponding on/off operations of the PMOS transistor M1 and the NMOS transistors M2, M3, and M4.

Vth1 through Vth8 indicate the threshold voltages of the MOS transistors M1 through M8, respectively.

When the input voltage Vin is at high-level, the NMOS transistors M3 and M4 both turn on. Because the NMOS transistor M4 is on, the gate voltage B of the NMOS transistor M2 is at the low-level and the NMOS transistor M2 turns off.

Because the NMOS transistor M3 is on, a bias current flows from the high-voltage power supply VH via the resistor R1 to the PMOS transistor M5 and the NMOS transistor M6, thereby dropping voltages corresponding to the threshold voltages of the PMOS transistor M5 and the NMOS transistor M6 (Vth5 and Vth6).

As a result, the gate voltage A of the PMOS transistor M1 assumes the voltage of the high-voltage power supply VH minus the sum of the threshold voltages of the PMOS transistor M6 and the NMOS transistor M7 (Vth5+Vth6), or VH−(Vth5+Vth6). Thus, the PMOS transistor M1 turns on, and the output signal assumes high-level.

When the input voltage Vin decreases to the sum of the threshold voltage Vth3 of the NMOS transistor M3 and the third bias voltage Vb3 (Vth3+Vb3), the NMOS transistor M3 turns off, thereby terminating the supply of bias current to the PMOS transistor M5 and the NMOS transistor M6.

However, the gate voltage A of the PMOS transistor M1 does not change because it is maintained by the capacitor C1.

As the input voltage Vin further decreases and drops below the threshold voltage Vth4 of the NMOS transistor M4, the NMOS transistor M4 turns off. As a result, a bias current is supplied to the series connection of the PMOS transistor M7 and the NMOS transistor M8 between the gate of the NMOS transistor M2 and the ground potential GND, from the low-voltage power supply VL via the resistor R2. Thus, the gate voltage B of the NMOS transistor M2 increases.

At the same time, the gate voltage A of the PMOS transistor M1 also increases with the same slope due to the capacitor C1.

When the gate voltage B increases to the threshold voltage Vth2 of the NMOS transistor M2, the gate voltage A is as follows:

$$\text{Gate voltage } A = VH - (Vth5 + Vth6) + Vth2 \quad \text{(Equation 1)}$$

Assuming that the threshold voltages Vth2 and Vth6 of the NMOS transistors M2 and M6, respectively, are equal, and that the threshold voltages Vth1 and Vth5 of the PMOS transistors M1 and M5, respectively, are equal, the gate voltage A is rewritten as follows:

$$\text{Gate voltage } A = VH - Vth1 \quad \text{(Equation 2)}$$

Thus, the PMOS transistor M1 turns off simultaneously with the turning on of the NMOS transistor M2 when the gate voltage B reaches the threshold voltage Vth2 of the NMOS transistor M2. This means that the output signal transitions from high-level to low-level accompanied with hardly any flow of through current.

Because the gate voltage B is clamped by the series connection of the PMOS transistor M7 and the NMOS transistor M8, the gate voltage B does not increase beyond the sum of the threshold voltages of these both transistors (Vth7+Vth8).

Assuming that the PMOS transistors M5 and M7, and the NMOS transistors M6 and M8 have the same threshold voltages, Vth5+Vth6=Vth7+Vth8. Thus, the gate voltage A increases only up to the voltage of the high-voltage power supply VH. Thus, the capacitor C1 is not discharged to the high-voltage power supply VH due to a parasitic diode or the like of the MOS transistors, as discussed with regard to the related art, thereby preventing the decrease in the terminal voltage of the capacitor C1.

The NMOS transistor M3 is turned off earlier than the NMOS transistor M4 for the following reasons.

For the sake of simplicity, a case is discussed in which the NMOS transistor M4 turns off before the NMOS transistor M3.

When the NMOS transistor M4 turns off and the gate voltage B increases, the gate voltage A also increases with the same slope.

As the gate voltage A increases, the drain current through the PMOS transistor M5 and the NMOS transistor M6 rapidly decreases. At this time, if the NMOS transistor M3 is still on, the charge of the capacitor C1 is discharged via the resistor R1, resulting in a decrease in the voltage across the capacitor C1. As a result, a sufficient amplitude cannot be supplied to the gate voltage A.

In order to overcome this problem, the third bias voltage Vb3 is provided between the source of the NMOS transistor M3 and the ground potential GND so that the NMOS transistor M3 turns off first, and the input voltage Vin at which the NMOS transistor M3 turns off is set higher than the threshold voltage Vth4 of the NMOS transistor M4.

When the input voltage Vin increases from low-level and exceeds the threshold voltage Vth4 of the NMOS transistor M4, the NMOS transistor M4 turns on, thereby bringing the gate voltage B down. As the gate voltage B decreases, the gate voltage A also decreases with the same slope due to the capacitor C1.

The gate voltage A when the gate voltage B has dropped to the threshold voltage Vth2 of the NMOS transistor M2 is as follows:

$$\text{Gate voltage } A = VH - (Vth7 + Vth8) + Vth2 \quad \text{(Equation 3)}$$

Assuming that the PMOS transistors M1 and M7 and the NMOS transistors M2 and M8 have the same threshold voltage, Vth7=Vth1 and Vth8=Vth2. Thus, Equation 3 is rewritten as follows:

$$\text{Gate voltage } A = VH - Vth1 \quad \text{(Equation 4)}$$

Equation 4 indicates that the gate voltage A decreases from the voltage of the high-voltage power supply VH to the threshold voltage Vth1 of the PMOS transistor M1.

Thus, because the NMOS transistor M2 and the PMOS transistor M1 turn off simultaneously, hardly any through current flows when the output signal transitions from low-level to high-level as well.

When the input signal Vin further increases and exceeds the sum of the threshold voltage Vth3 of the NMOS transistor M3 and the bias voltage Vb3 (Vth3+Vb3), the NMOS transistor M3 turns on, thereby resuming the supply of bias current to the PMOS transistor M6 and the NMOS transistor M7, which are each diode-connected.

Thus, in accordance with the present embodiment, the circuit for applying the gate bias voltage to the PMOS transistor M1 is provided by the series connection of the diode connections of the PMOS transistor M5 and the NMOS transistor M6. The circuit for applying the gate bias voltage to the NMOS transistor M2 is provided by the series connection of the diode connections of the PMOS transistor M7 and the NMOS transistor M8. Thus, the discharge of the capacitor C1 to the high-voltage power supply VH is prevented, so that the development of through current upon transition of the output signal from high-level to low-level or, conversely, from low-level to high-level, can be prevented.

Furthermore, because any shifts of the threshold voltages of the PMOS transistors and the NMOS transistors, either in the same direction or in different directions, variations due to a manufacturing process can be mutually compensated, so that the development of through current due to manufacturing process variations can also be prevented.

Because the gate signals of the PMOS transistor M1 and the NMOS transistor M2 have the same reduced amplitude, the speed of operation is increased compared with conventional circuits.

Embodiment 2

Figure 3:
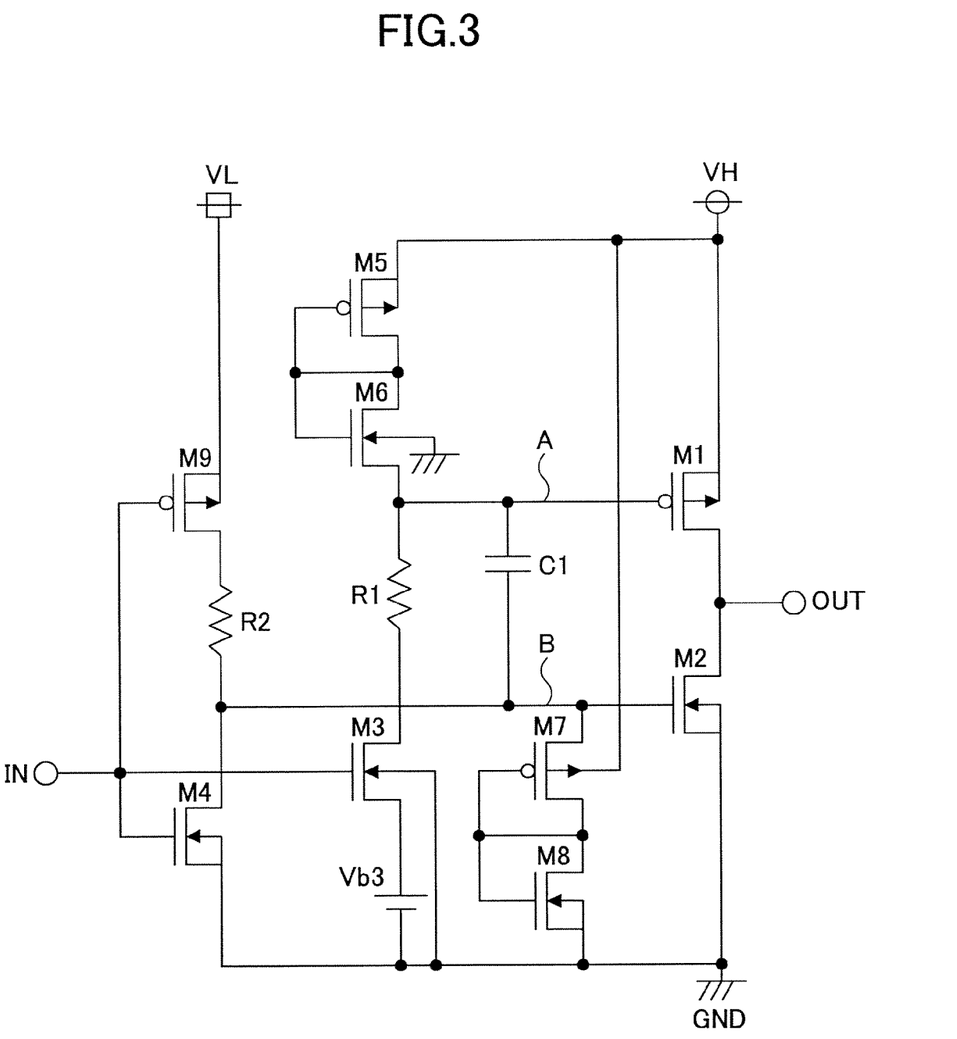
FIG. 3 shows a circuit diagram of a level shift circuit according to a second embodiment of the invention.

FIG. 3 shows a circuit diagram of a level shift circuit according to a second embodiment of the invention.

The level shift circuit shown in FIG. 3 differs from that shown in FIG. 1 in that there is provided, between the resistor R2 and the low-voltage power supply terminal VL, a PMOS transistor M9 which is a third switch unit.

In the level shift circuit of FIG. 3, the source of the PMOS transistor M9 cannot be connected to the high-voltage power supply VH.

In the following, an operation of the level shift circuit according to the second embodiment is described, focusing on those respects in which the level shift circuit differs from the first embodiment.

When the input voltage Vin is at high-level, the PMOS transistor M9 is off, whereby the current supply to the resistor R2 and the second bias generating circuit, which is composed of the PMOS transistor M7 and the NMOS transistor M8, is completely terminated.

As the input voltage Vin decreases and drops below the voltage of the low-voltage power supply VL minus the threshold voltage Vth9 of the PMOS transistor M9 (VL−Vth9), the PMOS transistor M9 turns on, whereby the supply of power to the second bias generating circuit is enabled. However, as long as the NMOS transistor M4 is on, the current that flows through the resistor R2 is bypassed by the NMOS transistor M4, so that the potential of the gate voltage B does not increase.

The operation of the circuit when the input voltage Vin further decreases is the same as that of the level shift circuit shown in FIG. 1 and is therefore not discussed.

Embodiment 3

Figure 4:
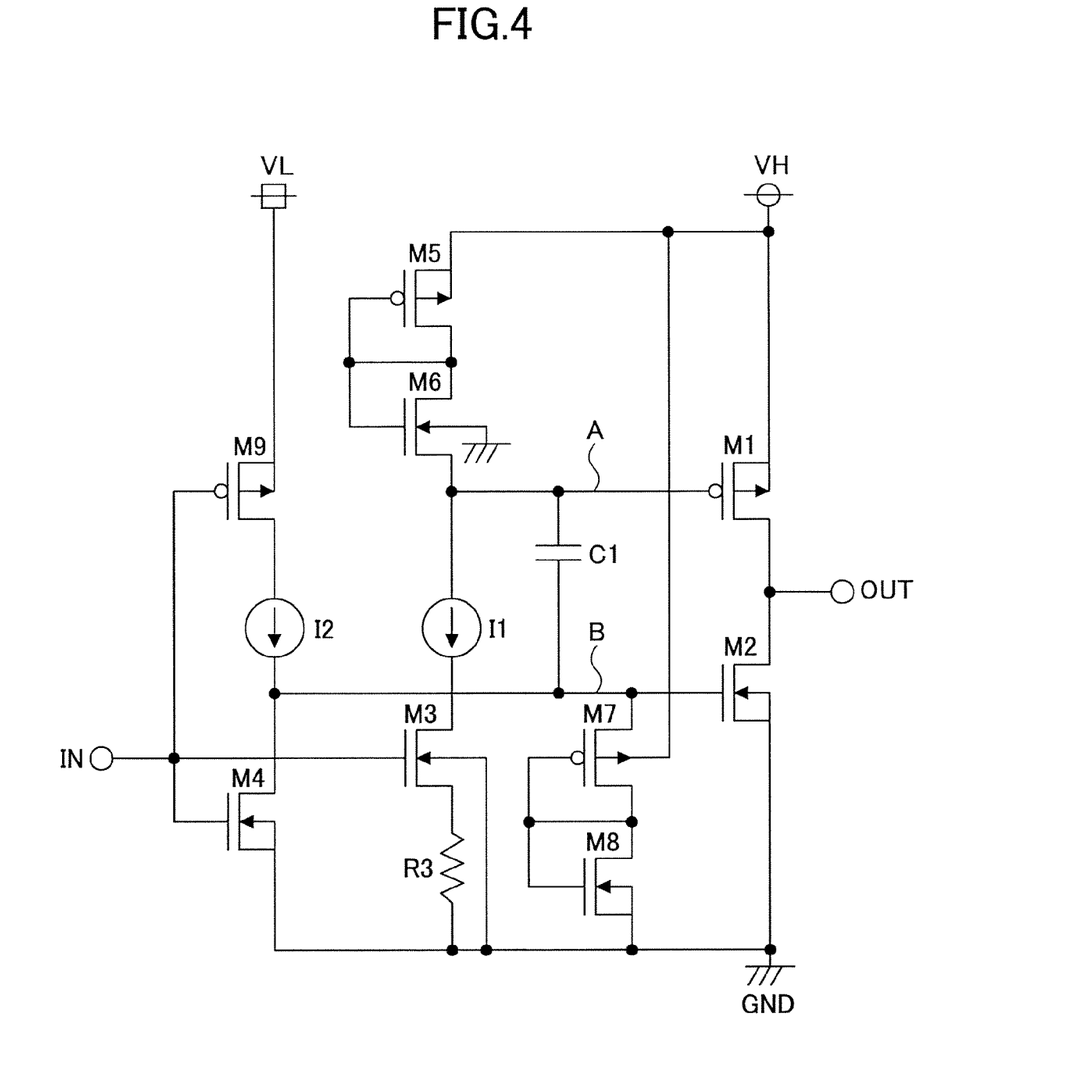
FIG. 4 shows a circuit diagram of a level shift circuit according to a third embodiment of the invention.

FIG. 4 shows a circuit diagram of a level shift circuit according to a third embodiment of the invention.

The level shift circuit according to the third embodiment differs from the level shift circuit of FIG. 3 in that the resistor R1 and the resistor R2 are replaced by a constant current source I1 and a constant current source I2, respectively, and the third bias voltage Vb3 is replaced by a resistor R3.

The operation of the level shift circuit shown in FIG. 4 is identical to that of the level shift circuit shown in FIG. 3. However, because of the use of the constant-current power supplies I1 and I2 in place of the resistors R1 and R2 in the level shift circuit of FIG. 4, the operation speed is increased with a small current consumption.

Because the third bias voltage Vb3 is replaced by the resistor R3, the bias voltage Vb3 produced by this resistor is the product of the current source I1 and the resistor R3 (R3×I1).

While in the level shift circuit shown in FIG. 4, both of the resistor R1 and the resistor R2 are replaced by the current source I1 and the current source I2, either one of them may be replaced. Alternatively, as in the level shift circuit shown in FIG. 1, the PMOS transistor M9 may be eliminated and one end of the current source I2 may be connected to the low-voltage power supply VL or the high-voltage power supply VH.

Embodiment 4

Figure 5:
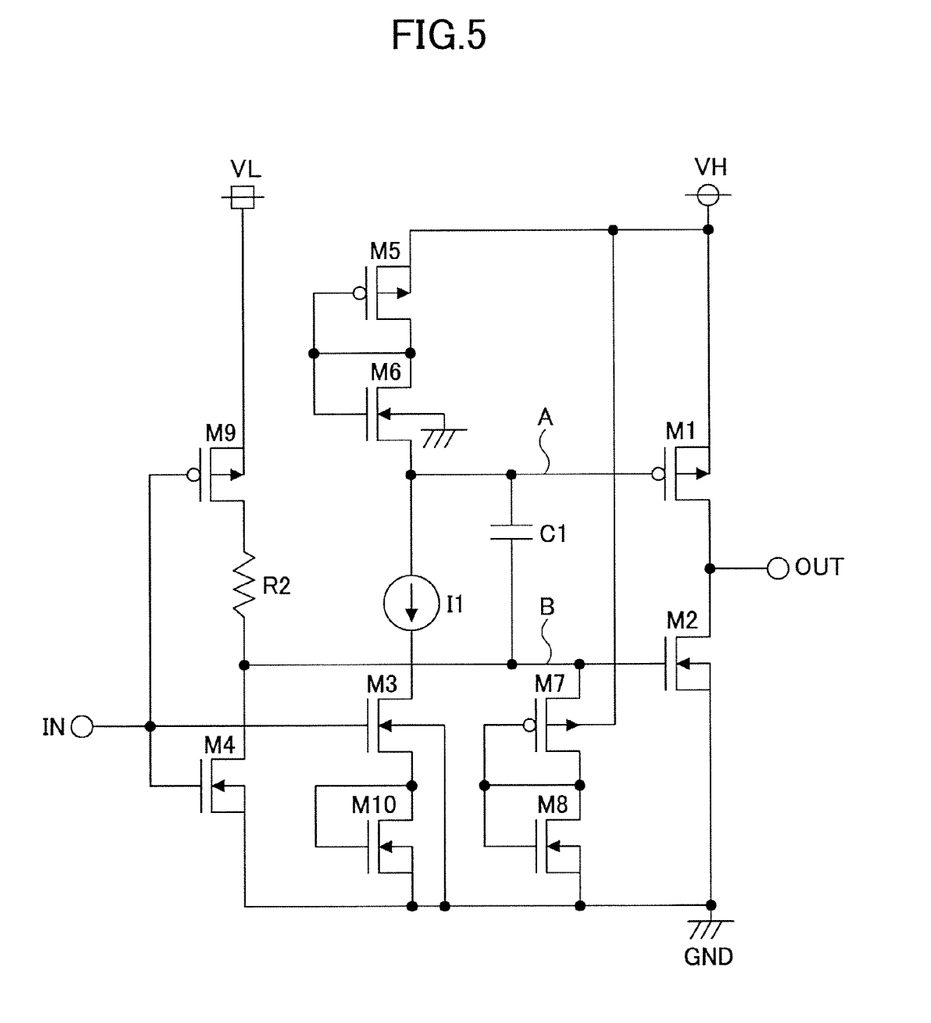
FIG. 5 shows a circuit diagram of a level shift circuit according to a fourth embodiment of the invention.

FIG. 5 shows a circuit diagram of a level shift circuit according to a fourth embodiment of the invention.

The level shift circuit shown in FIG. 5 differs from the level shift circuit shown in FIG. 3 in that the resistor R1 is replaced by a constant current source I1, and the bias voltage Vb3 is replaced by a diode-connected NMOS transistor M10.

The operation of the level shift circuit shown in FIG. 5 is also identical to that of the level shift circuit shown in FIG. 3. The use of the constant-current power supply I1 in place of the resistor R1 achieves an increase in operation speed with a small current consumption.

Further, because the bias voltage Vb is provided by the diode-connected NMOS transistor M10, the circuit structure is simplified.

By connecting a plurality of such transistors in series, the bias voltage can be adjusted to an appropriate value.

The foregoing embodiments are based on the assumption that the PMOS transistors M1, M5, and M7 have the same threshold voltage and that the NMOS transistors M2, M6, and M8 have the same threshold voltage. However, the threshold voltage of each of the PMOS transistors M5 and M7 may be made somewhat smaller than the threshold voltage of the PMOS transistor M1 by a predetermined value, or the threshold voltage of each of the NMOS transistors M6 and M8 may be made somewhat smaller than the threshold voltage of the NMOS transistor M2 by a predetermined value.

Both of the above alternatives may be employed. However, if the first bias voltage or the second bias voltage is made too small, the PMOS transistor M1 or the NMOS transistor M2 fails to turn on sufficiently. Thus, the extent of reduction should be determined by taking the characteristics of the PMOS transistor M1 and the NMOS transistor M2 into consideration.

Figure 6:
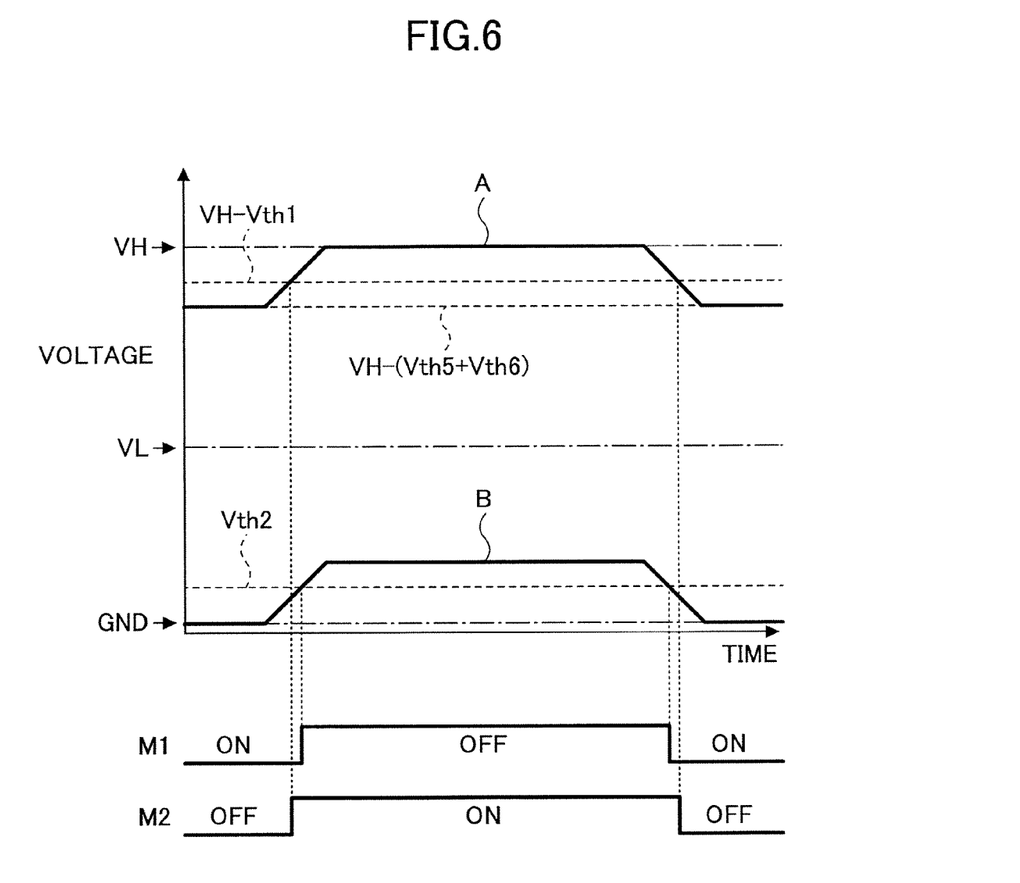
FIG. 6 shows a timing chart illustrating an operation of the level shift circuit shown in FIG. 5.
Figure 7:
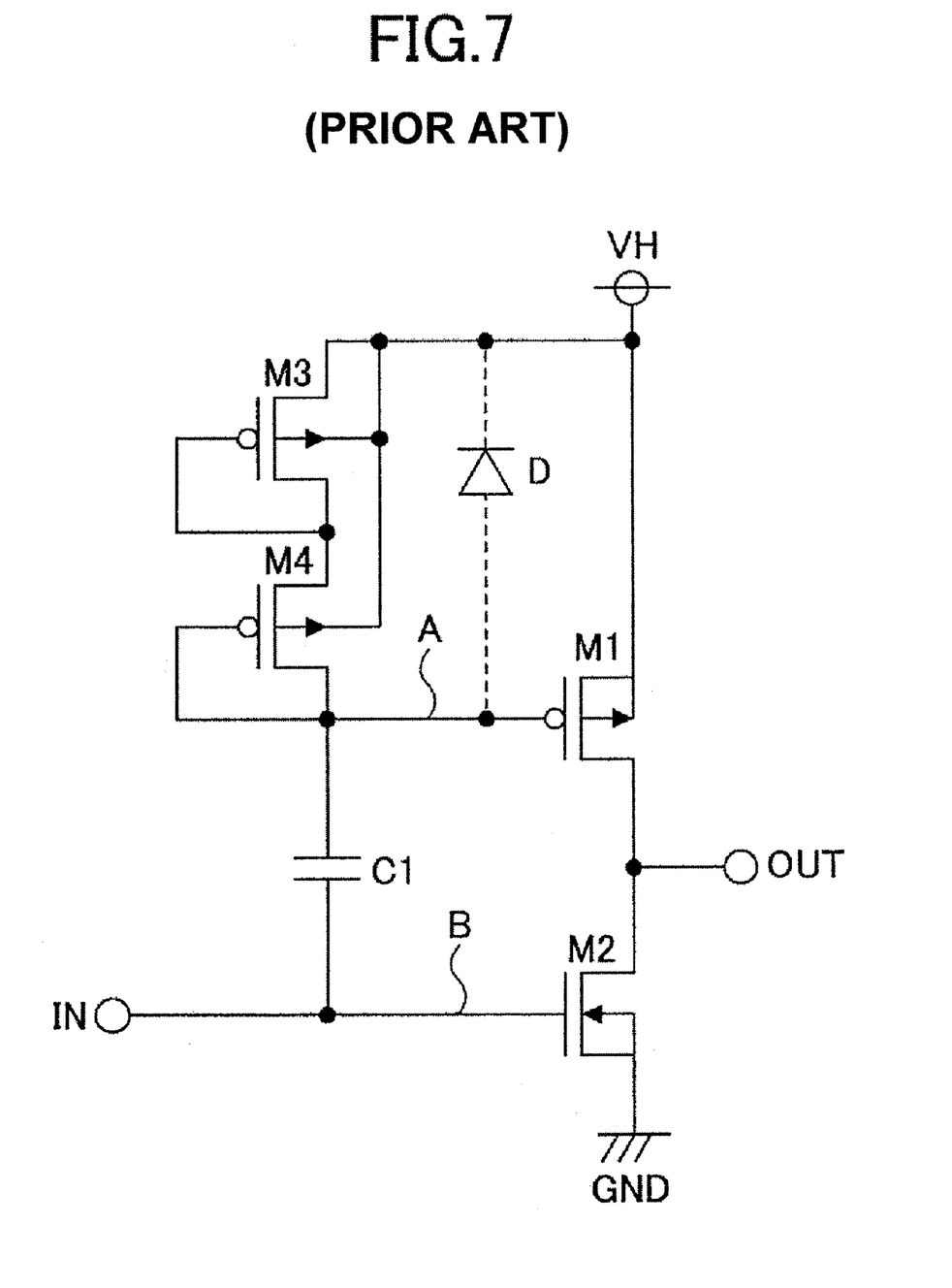
FIG. 7 shows a circuit diagram of a conventional level shift circuit.
Figure 8:
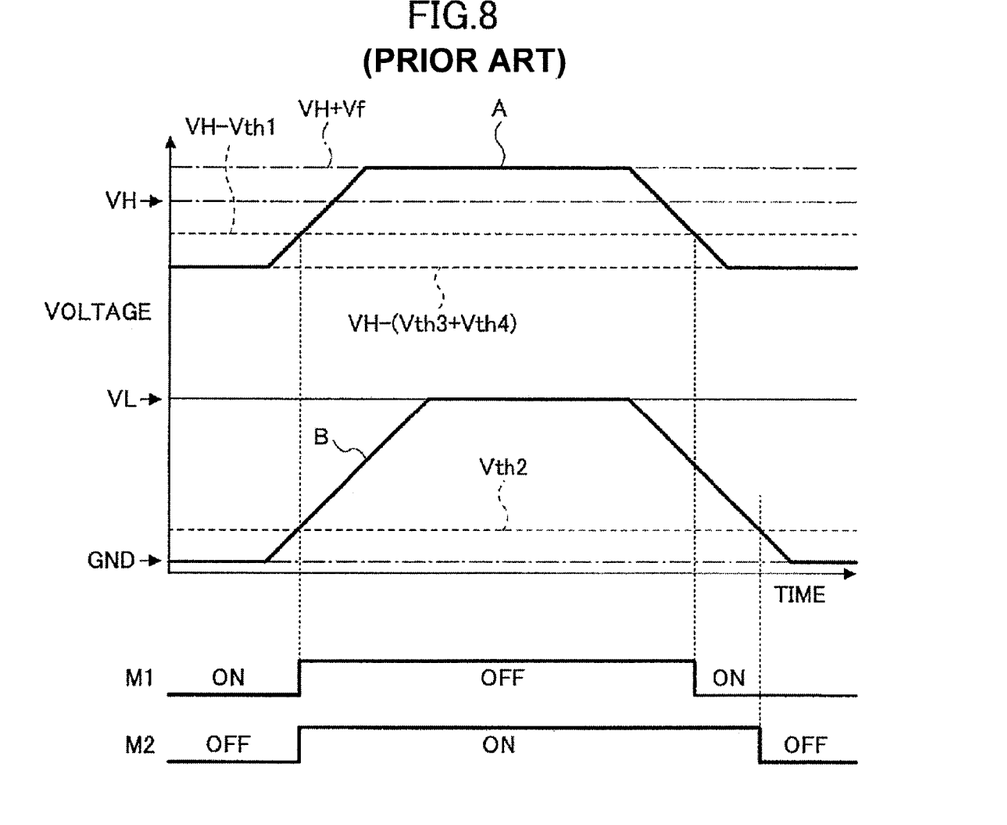
FIG. 8 shows a timing chart illustrating an operation of the conventional level shift circuit shown in FIG. 7.

FIG. 6 shows a timing chart illustrating an operation of the level shift circuit according to the present embodiment.

In FIG. 6, the PMOS transistors M1, M5, and M7 have the same threshold voltages (Vth1, Vth5, Vth7), and the threshold voltages of the NMOS transistors M6 and M8 (Vth6 and Vth8) are smaller than the threshold voltage Vth2 of the NMOS transistor M2. The signs indicate the same as in FIG. 2.

As shown in FIG. 6, when the gate voltage B increases and reaches the threshold voltage Vth2 of the NMOS transistor M2, the gate voltage A is as follows:

$$\text{Gate voltage } A = VH - (Vth5 + Vth6) + Vth2 \quad \text{(Equation 5)}$$

Due to the aforementioned conditions, Vth5=Vth1, and Vth6<Vth2, the gate voltage A is expressed as follows:

$$\text{Gate voltage } A = VH - Vth1 + (Vth2 - Vth6) \quad \text{(Equation 6)}$$

Because (Vth2−Vth6) in Equation 6 is a positive voltage, when the gate voltage B reaches the threshold voltage Vth2 of the NMOS transistor M2 and the NMOS transistor M2 turns on, the gate voltage A is already above the voltage at which the PMOS transistor M1 turns off.

Namely, when the output signal transitions from high-level to low-level, the PMOS transistor M1 and the NMOS transistor M2 turn on or off via a period in which they are simultaneously off. Thus, the through current due to the PMOS transistor M1 and the NMOS transistor M2 can be completely prevented.

When the gate voltage B decreases from the voltage of Vth7+Vth8 to the ground potential (0V), too, the transition of the output signal from low-level to high-level passes through the period in which both of the PMOS transistor M1 and the NMOS transistor M2 are off, so that the through current can be completely prevented.

When the conditions are changed such that the NMOS transistors M2, M6, and M8 have the same threshold voltages (Vth2, Vth6, Vth8) while the threshold voltages of the PMOS transistors M5 and M7 (VthS and Vth7) are smaller than the threshold voltage Vth1 of the PMOS transistor M1, there is also the period in which both the PMOS transistor M1 and the NMOS transistor M2 are off at the same time, whereby the through current can be completely prevented.

The through current can also be eliminated in the case where the threshold voltages of the PMOS transistors M5 and M7 (Vth5 and Vth7) are made smaller by a predetermined value than the threshold voltage Vth1 of the PMOS transistor M1, and the threshold voltages of the NMOS transistors M6 and M8 (Vth6 and Vth8) are made smaller than the threshold voltage Vth2 of the NMOS transistor M2 by a predetermined value.

The threshold voltage of a MOS transistor can be adjusted by changing the ratio of gate width to gate length (W:L). Thus, different threshold voltages can be set by changing the W:L ratios of the PMOS transistors M1, M5, and M7, or the W:L ratios of the NMOS transistors M2, M6, and M8.

Because the threshold voltage also varies depending on the drain current, the aforementioned conditions can be realized by reducing the current supplied to the bias generating circuits. For this purpose, the resistor values of the resistors R1 and R2, or the current values of the current sources I1 and I2, in the level shift circuit shown in FIG. 1, 3, 4, or 5 may be appropriately adjusted.

Although this invention has been described in detail with reference to certain embodiments, variations and modifications exist within the scope and spirit of the invention as described and defined in the following claims.

The present application is based on the Japanese Priority Application No. 2007-306788 filed Nov. 28, 2007, the entire contents of which are hereby incorporated by reference.

What is claimed is:

1. A level shift circuit for producing a high voltage amplitude output signal from a low voltage amplitude input signal, the circuit comprising:
    complementary-type first and second transistors that are connected in series between a high-voltage power supply and a ground potential;
    a capacitor connected between control electrodes of the first and second transistors;
    a first bias generating circuit connected to the high-voltage power supply and the control electrode of the first transistor, the first bias generating circuit being configured to apply a first bias voltage to the control electrode of the first transistor;
    a second bias generating circuit connected to the ground potential and the control electrode of the second transistor, the second bias generating circuit being configured to apply a second bias voltage to the control electrode of the second transistor;
    a first switch unit configured to turn on or off depending on the low voltage amplitude input signal in order to supply power to the first bias generating circuit while the output signal is at a high-level and to stop the supply of power to the first bias generating circuit while the output signal is at a low-level; and
    a second switch unit configured to turn on or off depending on the low voltage amplitude input signal in order to stop a supply of power to the second bias generating circuit while the output signal is at the high-level, and to supply power to the second bias generating circuit while the output signal is at the low-level,
    wherein the high voltage amplitude output signal is outputted from a connecting node of the first and second transistors,
    wherein the first bias generating circuit includes a first voltage limiting circuit connected between the high-voltage power supply and the control electrode of the first transistor, and a first bias current generating circuit configured to supply a first bias current to the first voltage limiting circuit, wherein the first voltage limiting circuit includes a series connection of a diode-connected transistor having the same characteristics as those of the first transistor and a diode-connected transistor having the same characteristics as those of the second transistor, and
    wherein the second bias generating circuit includes a second voltage limiting circuit connected between the control electrode of the second transistor and the ground potential, and a second bias current generating circuit configured to supply a second bias current to the second voltage limiting circuit, wherein the second voltage limiting circuit includes a series connection of a diode-connected transistor having the same characteristics as those of the first transistor and a diode-connected transistor having the same characteristic as those of the second transistor.

2. The level shift circuit according to claim 1, wherein the first and second bias voltages are the same and are either equal to a sum of threshold voltages of the first transistor and the second transistor or smaller than the sum by a predetermined value.

3. The level shift circuit according to claim 1, wherein a threshold voltage of at least one of the transistor having the same conductivity type as the first transistor and the transistor having the same conductivity type as the second transistor in each of the first and second voltage limiting circuits is lower than the threshold voltage of the first transistor or the second transistor of the corresponding conductivity type.

4. The level shift circuit according to claim 1, wherein the first bias current generating circuit includes a first current limiting unit of which one end is connected to the control electrode of the first transistor, and the first switch unit connected between the other end of the first current limiting unit and the ground potential.

5. The level shift circuit according to claim 4, wherein the first current limiting unit includes a resistor or a constant current source.

6. The level shift circuit according to claim 1, wherein the second bias current generating circuit includes a second current limiting unit of which one end is connected to the control electrode of the second transistor and of which the other end is connected to the high-voltage power supply or a power supply whose voltage is lower than that of the high-voltage power supply.

7. The level shift circuit according to claim 6, further comprising a third switch unit connected between the other end of the second current limiting unit and the power supply whose voltage is lower than that of the high-voltage power supply, wherein the third switch unit is turned on or off depending on the low voltage amplitude input signal.

8. The level shift circuit according to claim 7, wherein the third switch unit turns off while the output signal is at the high-level and turns on while the output signal is at the low-level.

9. The level shift circuit according to claim 6, wherein the second current limiting unit includes a resistor or a constant current source.

10. The level shift circuit according to claim 1, wherein the second switch unit is connected between the control electrode of the second transistor and the ground potential.

11. The level shift circuit according to claim 1, wherein the first switch unit turns on while the output signal is at the high-level and turns off while the output signal is at the low-level.

12. The level shift circuit according to claim 1, wherein the second switch unit turns on while the output signal is at the high-level and turns off while the output signal is at the low-level.

13. A level shift circuit for producing a high voltage amplitude output signal from a low voltage amplitude input signal, the circuit comprising:
   complementary-type first and second transistors that are connected in series between a high-voltage power supply and a ground potential;
   a capacitor connected between control electrodes of the first and second transistors;
   a first bias generating circuit connected to the high-voltage power supply and the control electrode of the first transistor, the first bias generating circuit being configured to apply a first bias voltage to the control electrode of the first transistor;
   a second bias generating circuit connected to the ground potential and the control electrode of the second transistor, the second bias generating circuit being configured to apply a second bias voltage to the control electrode of the second transistor;
   a first switch unit configured to turn on or off depending on the low voltage amplitude input signal in order to supply power to the first bias generating circuit while the output signal is at a high-level and to stop the supply of power to the first bias generating circuit while the output signal is at a low-level; and
   a second switch unit configured to turn on or off depending on the low voltage amplitude input signal in order to stop a supply of power to the second bias generating circuit while the output signal is at the high-level, and to supply power to the second bias generating circuit while the output signal is at the low-level,
   wherein the high voltage amplitude output signal is outputted from a connecting node of the first and second transistors,
   wherein each of the first switch unit and the second switch unit includes a transistor having the same characteristics as those of the second transistor, wherein the low voltage amplitude input signal of the same phase is applied to a control electrode of each of the first switch unit and the second switch unit, and wherein the first switch unit is configured to turn off first when the first switch unit and the second switch unit transition from an on-state to an off-state depending on the input signal.

14. A level shift circuit for producing a high voltage amplitude output signal from a low voltage amplitude input signal, the circuit comprising:
   complementary-type first and second transistors that are connected in series between a high-voltage power supply and a ground potential;
   a capacitor connected between control electrodes of the first and second transistors;
   a first bias generating circuit connected to the high-voltage power supply and the control electrode of the first transistor, the first bias generating circuit being configured to apply a first bias voltage to the control electrode of the first transistor;
   a second bias generating circuit connected to the ground potential and the control electrode of the second transistor, the second bias generating circuit being configured to apply a second bias voltage to the control electrode of the second transistor;
   a first switch unit configured to turn on or off depending on the low voltage amplitude input signal in order to supply power to the first bias generating circuit while the output signal is at a high-level and to stop the supply of power to the first bias generating circuit while the output signal is at a low-level;
   a second switch unit configured to turn on or off depending on the low voltage amplitude input signal in order to stop a supply of power to the second bias generating circuit while the output signal is at the high-level, and to supply power to the second bias generating circuit while the output signal is at the low-level, wherein the high voltage amplitude output signal is outputted from a connecting node of the first and second transistors; and
   a third bias generating circuit connected between the first switch unit and the ground potential and configured to produce a third bias voltage.

15. The level shift circuit according to claim 14, wherein the third bias generating circuit includes a series connection of one or more diode-connected transistors.

16. The level shift circuit according to claim 14, wherein the third bias generating circuit includes a resistor.

* * * * *